(12) United States Patent
Kaneko

(10) Patent No.: US 9,258,899 B2
(45) Date of Patent: Feb. 9, 2016

(54) METHOD OF FABRICATING A WIRING BOARD

(71) Applicant: SHINKO ELECTRIC INDUSTRIES CO., LTD., Nagano-shi, Nagano (JP)

(72) Inventor: Kentaro Kaneko, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 592 days.

(21) Appl. No.: 13/712,352

(22) Filed: Dec. 12, 2012

(65) Prior Publication Data

US 2013/0097856 A1    Apr. 25, 2013

Related U.S. Application Data

(62) Division of application No. 12/126,329, filed on May 23, 2008, now Pat. No. 8,357,860.

(30) Foreign Application Priority Data

May 30, 2007    (JP) ................................. 2007-143340

(51) Int. Cl.
*H05K 3/00* (2006.01)
*H05K 3/10* (2006.01)
(Continued)

(52) U.S. Cl.
CPC .......... *H05K 3/007* (2013.01); *H01L 23/49811* (2013.01); *H01L 23/49838* (2013.01);
(Continued)

(58) Field of Classification Search
CPC ............... H01L 23/49838; H01L 23/49811; H01L 23/498; H01L 23/49822; H01L 2221/68345; H01L 2224/16; H01L 2224/48091; H01L 2224/48227; H01L 2924/01046; H01L 2924/01078; H01L 2924/01079; H01L 2924/00014; H01L 24/48; H05K 1/113; H05K 3/243; H05K 3/007; H05K 3/06; H05K 3/4038; H05K 3/205; H05K 3/4644; H05K 2201/09472; H05K 2201/09845; H05K 2203/0376; Y10T 29/49224
USPC ............ 29/830–832, 846, 852; 156/235, 239, 156/252, 272.2, 289; 174/258, 260, 262
See application file for complete search history.

(56) References Cited

U.S. PATENT DOCUMENTS 5,480,503 A * 1/1996 Casey et al. ..................... 29/830
6,418,615 B1 * 7/2002 Rokugawa et al. ............. 29/852
(Continued)

FOREIGN PATENT DOCUMENTS

CN    1430272    7/2003
JP    2002-190549    7/2002
(Continued)

OTHER PUBLICATIONS

Japanese Office Action issued May 21, 2013, Application No. 2012-212746, with English translation, 9 pages.

Primary Examiner — Donghai D Nguyen
(74) Attorney, Agent, or Firm — Rankin, Hill & Clark LLP

(57) ABSTRACT

A method of fabricating a wiring board includes forming a surface plating layer on a support member, and forming an external connecting pad on the surface plating layer formed on the support member such that an area of the external connecting pad formed on the surface plating layer is smaller than an area of the surface plating layer. The method also includes forming an insulating layer and a wiring layer on a surface of the support member where the external connecting pad is formed, and removing the support member.

11 Claims, 11 Drawing Sheets

(51) Int. Cl.
  *H05K 1/11* (2006.01)
  *H05K 3/24* (2006.01)
  *H05K 3/06* (2006.01)
  *H05K 3/40* (2006.01)
  *H01L 23/498* (2006.01)
  *H05K 3/20* (2006.01)
  *H05K 3/46* (2006.01)
  *H01L 23/00* (2006.01)

(52) U.S. Cl.
  CPC ............... *H05K1/113* (2013.01); *H05K 3/06* (2013.01); *H05K 3/243* (2013.01); *H05K 3/4038* (2013.01); *H01L 23/498* (2013.01); *H01L 23/49822* (2013.01); *H01L 24/48* (2013.01); *H01L 2221/68345* (2013.01); *H01L 2224/16* (2013.01); *H01L 2224/48091* (2013.01); *H01L 2224/48227* (2013.01); *H01L 2924/01046* (2013.01); *H01L 2924/01078* (2013.01); *H01L 2924/01079* (2013.01); *H01L 2924/12042* (2013.01); *H05K 3/205* (2013.01); *H05K 3/4644* (2013.01); *H05K 2201/09472* (2013.01); *H05K 2201/09845* (2013.01); *H05K 2203/0376* (2013.01); *Y10T 29/49155* (2015.01); *Y10T 29/49156* (2015.01); *Y10T 29/49165* (2015.01); *Y10T 29/49224* (2015.01)

(56) References Cited

U.S. PATENT DOCUMENTS

| | | | |
|---|---|---|---|
| 6,614,113 | B2 | 9/2003 | Watanabe et al. |
| 6,784,554 | B2 | 8/2004 | Kajiwara et al. |
| 7,093,356 | B2 | 8/2006 | Imafuji et al. |
| 7,141,878 | B2 | 11/2006 | Homma |
| 7,397,000 | B2 * | 7/2008 | Shimoto et al. ............... 174/258 |
| 7,435,680 | B2 | 10/2008 | Nakamura et al. |
| 7,488,896 | B2 | 2/2009 | Saiki et al. |
| 7,514,779 | B2 | 4/2009 | Hirose et al. |
| 7,568,922 | B2 | 8/2009 | Yamashita et al. |
| 7,626,829 | B2 | 12/2009 | Watanabe et al. |
| 7,714,233 | B2 | 5/2010 | Kawamura et al. |
| 7,911,038 | B2 | 3/2011 | Kikuchi et al. |
| 2005/0039948 | A1 | 2/2005 | Asai et al. |
| 2007/0095471 | A1 | 5/2007 | Ito et al. |

FOREIGN PATENT DOCUMENTS

| | | |
|---|---|---|
| JP | 2003-197673 | 7/2003 |
| JP | 2004-228226 | 8/2004 |
| JP | 2006-186321 | 7/2006 |
| JP | 2007-013092 | 1/2007 |
| WO | 03/039219 | 5/2003 |
| WO | 2008/001915 | 1/2008 |

* cited by examiner

FIG. 11
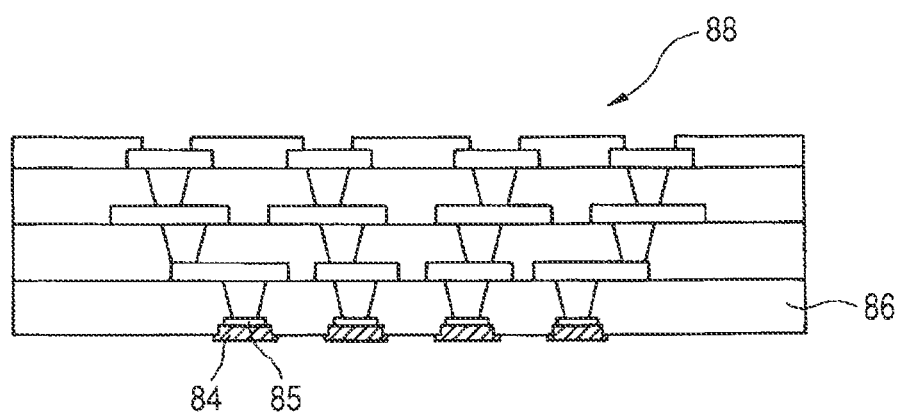
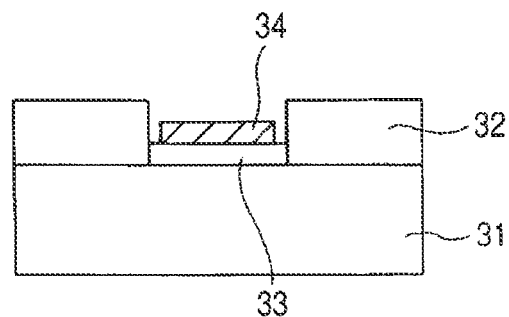
FIG. 12A
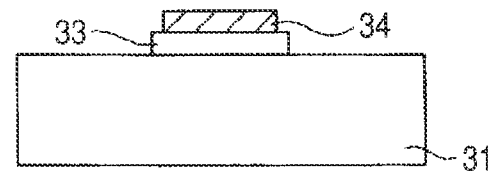
FIG. 12B

METHOD OF FABRICATING A WIRING BOARD

This application claims priority to Japanese Patent Application No. 2007-143340, filed May 30, 2007, in the Japanese Patent Office. The Japanese Patent Application No. 2007-143340 is incorporated by reference in its entirety.

TECHNICAL FIELD

The present disclosure relates to a wiring board and its fabricating method. More specifically, the present disclosure relates to a wiring board provided with a pad for mounting a semiconductor element or the like on one face and provided with a pad for connecting to other mounting board on the other face.

RELATED ART

A wiring board used for forming a semiconductor element, other electronic part or the like onto a package is provided with a pad for mounting the semiconductor element, the electronic part or the like on one face and provided with a pad for connecting to other mounting board on the other face. Surfaces of the external connecting pads are provided with surface plating layers for connecting to the semiconductor element or the like and bonding to a solder bump used for connecting to the mounting board. The surface plating layer is formed by thinly plating nickel (Ni), gold (Au) or the like from a side of the pad.

FIG. 13 shows an example of an external connecting pad in a wiring board fabricated by a normal build up technology. An external connecting pad 101 of the drawing is formed by a conductive material of copper (Cu) or the like on an insulating layer 102 on an outermost side of the wiring board, and connected to a pad 104 formed at one end of a wiring 103 of a lower layer by way of a via 105 penetrating the insulating layer 102 at a position in correspondence with the external connecting pad 101. A topmost surface of the wiring board is provided with a solder resist layer 106, and the solder resist layer 106 is arranged with an opening portion 107 for exposing a portion of an upper face of the external connecting pad 101. A surface plating layer 108 is arranged at the exposed upper face of the external connect log pad 101.

There is a method of fabricating a wiring board without using a core substrate for alternately forming wiring layers and insulating layers on both faces of the core substrate by as build up technology. This method includes forming firstly a first external connecting pad (which will be a pad on one face side of the wiring board) along with a surface plating layer on a support member of a copper plate or the like, forming insulating layers and wiring layers by necessary numbers thereon by a build up technology, successively forming a second external connecting pad (which will be a pad on the other face side of the wiring board), thereafter, removing the support member (for example, Patent Reference 1).

FIG. 14 shows an example of an external connecting pad on one face side (formed first on a support member) of a wiring board fabricated by the method. One side of an external connecting pad 121 is covered by a surface plating layer 122, and a surface of the surface plating layer 122 is exposed to a surface of an insulating layer 123 on an outermost side. The external connecting pad 121 is connected to a pad 126 provided at one end of a wiring 125 of a lower layer by way of a via 124 penetrating the insulating layer 123. An external connecting pad on the other face side of the wiring board is similar to that explained in reference to FIG. 13.

[Patent Reference 1] JP-T-003/039219

According to the external connecting pad 101 of the wiring board of the related-art explained in reference to FIG. 13, the opening portion 107 is formed at the solder resist layer 106 formed by covering an entire face of the wiring board after forming the external connecting pad 101 to expose a portion of the external connecting pad 101 for connecting to a semiconductor element or an external circuit. Therefore, the external connecting pad 101 needs to be formed to be larger than the opening portion 107 of the solder resist layer 106 to hamper miniaturization in wiring.

Further, since the external connecting pad 201 is formed to be large, an amount of a resin present between the external connecting pad 101 and the pad 104 of a lower layer wiring (in details, a resin present between vertical broken lines, a lower face of the pad 101, an upper face of the pad 104, and side faces of the via 105) is large, and a connection reliability of the via may be deteriorated by a stress brought about by heating and shrinking the resin.

In a case of external connecting pad 121 of a wiring board of the related-art explained in reference to FIG. 14, the above-described problem can be resolved. However, the surface plating layer 122 and the pad 121 therebelow are provided with the same size, and therefore, as shown by FIG. 15, a crack 131 generated by a stress between the surface plating layer 122 and the insulating layer 123 is liable to permeate an inner portion of the insulating layer 123 along a side face of the pad 121 to be liable to cause a deterioration in a function of the wiring board.

SUMMARY

Exemplary embodiments of the present invention provide a wiring board having an external connecting pad on one face side, which does not hamper miniaturization of wirings, is capable of maintaining a connection reliability of a via and difficult to cause a deterioration in a function of the wiring board.

A wiring board of the invention is a wiring board comprising:

an insulating layer;

a wiring layer provided on one face side of the insulating layer;

an external connecting pad provided on the other face side of the insulating layer;

a surface plating layer formed on the external connecting pad, for connecting to an external circuit, wherein an area of the external, connecting pad is smaller than an area of the surface plating layer.

The wiring board of the invention can be fabricated by a method of fabricating a wiring board, comprising steps of:

forming a surface plating layer on a support member and forming an external connecting pad on the surface plating layer formed on the support member;

processing the external connecting pad to make the area of the external connecting pad smaller than the area of the surface plating layer;

forming an insulating layer and a wiring layer on a surface of the support member formed where the external connecting pad is formed; and a step of removing the support member by etching.

Preferably, processing of making the area of the external connecting pad smaller than the area of the surface plating layer is carried out by etching.

According to the invention, there can be provided a wiring board including an external connecting pad on one face side, which is advantageous for miniaturization of a wiring, capable of maintaining a connection reliability of a via and useful also for restraining a deterioration in a function of the wiring board.

Other features and advantages may be apparent from the following detailed description, the accompanying drawings and the claims.

BRIEF DESCRIPTION OF THE DRAWINGS

FIG. 11 is a view for explaining the wiring board fabricated in example 4.

FIGS. 12A and 12B are views for explaining selective etching of the external connecting pad carried out before exfoliating a plating resist pattern in example 1.

DETAILED DESCRIPTION

A characteristic of a wiring board of the invention resides in that an area of an external connecting pad at one face side of the wiring board is smaller than an area of a surface plating layer thereof.

Figure 1:
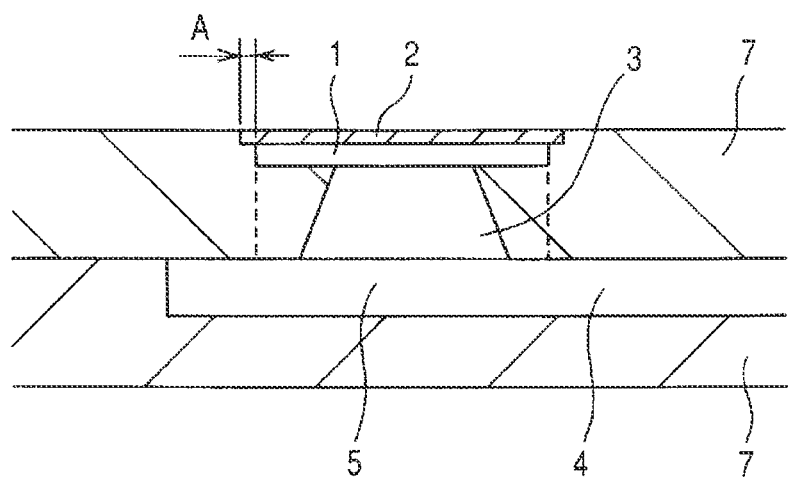
FIG. 1 is a view for explaining an external connecting pad having an area smaller than that of a surface plating layer in a wiring board of the invention.

FIG. 1 shows an external connecting pad 1 of the invention. The pad 1 includes a surface plating layer 2 on a side for connecting to an external circuit, and the pad 1 is formed such that a size (area) thereof is made to be smaller than a size (area) of the surface plating layer 2. For an object of the invention, the smaller the size of the pad 1, the better. However, a lower limit of size of the pad 1 depends on an accuracy in view of a fabricating step which is made to be necessary for ensuring bonding with a via 3 connected to a wiring 4 at inside of the wiring board. On the other hand, a size of the surface plating layer 2 mounted to the pad 1 depends on a size of a bump (not illustrated) connected thereto. An actual size of the pad 1 needs to be determined in consideration thereof. Taking an example, in a standard board, an interval in a horizontal direction between an outer peripheral portion of the pad 1 and an outer peripheral portion of the surface plating layer 2 (a dimension designated by notation A of FIG. 1) can be constituted by about 0.1 through 5 μm preferably, about 1 through 3 μm. In FIG. 1, the via 3 is actually disposed at a position in correspondence with the pad 1 and connected to the wiring 4 by way of a pad 5 connected to one end of the wiring 4. The external connecting pad 1, the surface plating layer 2, the via 3, the wiring 4, and the pad 5 connected to the wiring 4 are present at inside of an insulating layer 7 except upper face of the surface plating layer 2.

Figure 13:
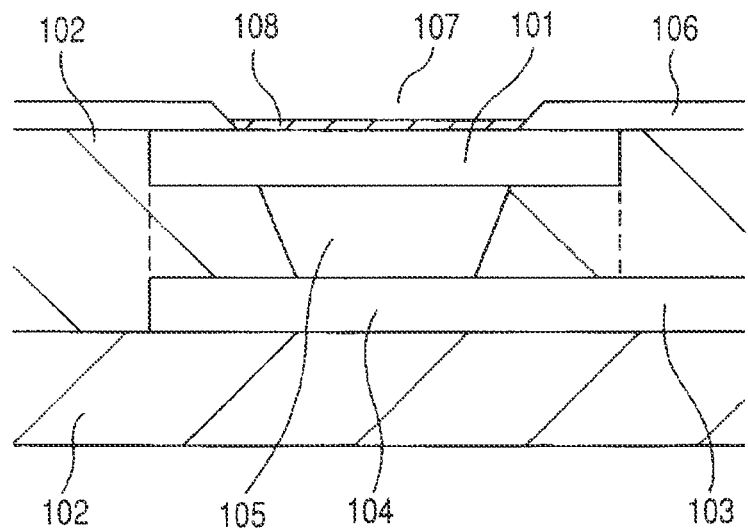
FIG. 13 is a view for explaining an external connecting pad of a wiring board of a related-art fabricated by a build up technology.

In a case of the related-art explained previously in reference to FIG. 13, the size of the opening portion 107 of the solder resist layer 106 communicating with the pad 101 for connecting to the external circuit rectifies the size of the plating layer 108 disposed there and depends on the size of the bump connected thereto. The pad 101 needs to be formed to be larger than the opening portion 107, that is, larger than the surface plating layer from a necessity of forming the solder resist layer 106 covering the pad 101 and thereafter forming the opening portion 107 at the layer.

In contrast thereto, in the case of the invention, the external connecting pad 1 is made to be smaller than the surface plating layer 2. Therefore, according to the wiring board of the invention, the wiring can be miniaturized and an amount of resin present between the external connecting pad 1 and the pad 5, that is, an amount of resin present between vertical broken lines, a lower face of the pad 1, an upper face of the pad 5, and a side face of the via 3 shown in FIG. 1 is made to be smaller than that in the case of the related-art explained in reference to FIG. 13, and a connection reliability of the via caused by a stress in accordance with heating and shrinking the resin can also be maintained.

Figure 14:
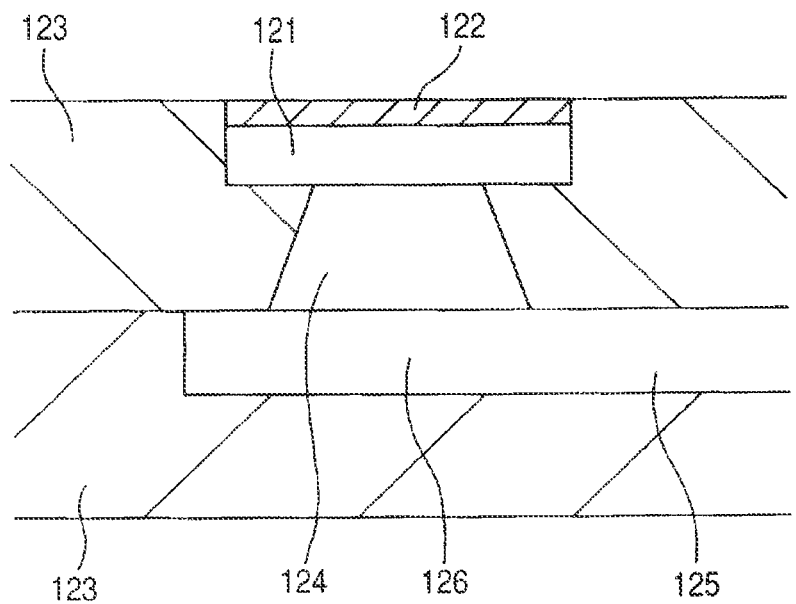
FIG. 14 is a view for explaining an external connecting pad of a wiring board of another related art.
Figure 15:
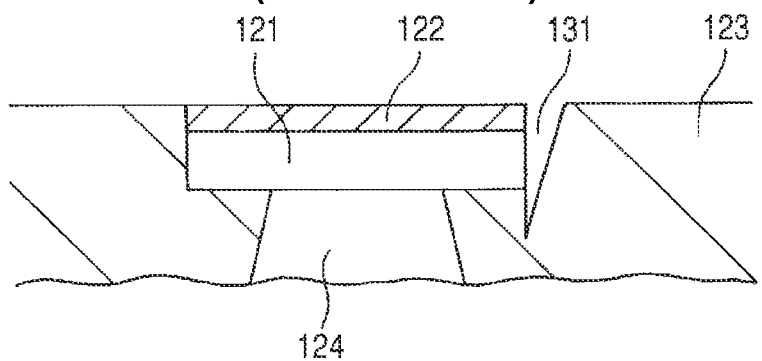
FIG. 15 is a view for explaining of a crack generated between a surface plating layer and an insulating layer in a pad portion explained in FIG. 14.

In the case of the related-art previously explained in reference to FIG. 14, as shown by FIG. 15, there poses a problem that the crack 131 generated owing to the stress between the surface plating layer 122 and the insulating layer 123 is liable to permeate inside of the insulating layer 123 along the side face of the pad 121 to be liable to cause a deterioration in the function of the wiring board.

Figure 2:
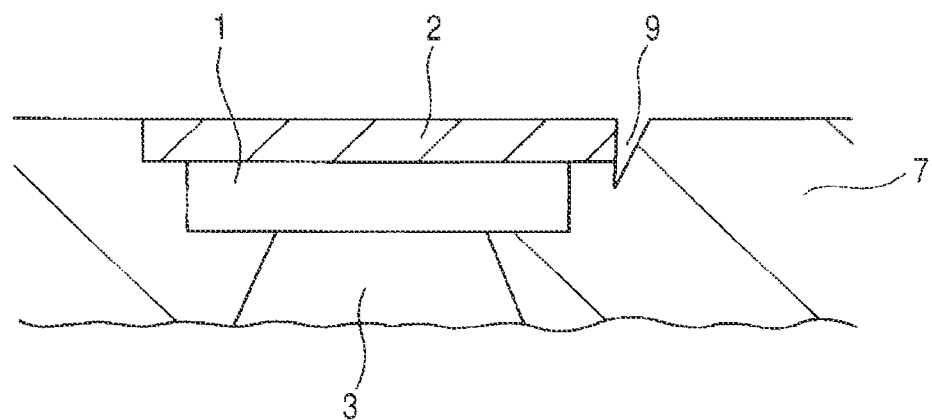
FIG. 2 is a view for explaining of a crack generated between the surface plating layer and an insulating layer at a portion of the external connecting pad smaller than the surface plating layer of the Wiring board of the invention.

In contrast thereto, in the case of the invention, as shown by FIG. 2, a crack 9 generated between the surface plating layer 2 and the insulating layer 7 is stopped to a location of being propagated along a side face of the surface plating layer 2 and is not propagated so deeply into the insulating layer 7. Thereby, the problem of the deterioration in the function of the wiring board by the crack is avoided.

According to the invention, 'external circuit' indicates a circuit which is disposed at outside of a wiring board and to which the wiring board is connected. For example, as 'external circuit' according to the invention, a circuit of an electronic part of a semiconductor element or the like connected to a wiring board, a circuit of a mounting board connected with a wiring board mounted with such a semiconductor element or the like can be pointed out.

Materials of respective members constituting the wiring board of the invention may be similar to materials of equivalent members in a normal wiring board. For example, as a material of an external connecting pad, a general wiring material of copper (Cu) or an alloy thereof can be pointed out. As a material of a surface plating layer provided on an external connecting pad, (1) a combination of Ni and Au, (2) a combination of Ni and Pd and Au, (3) Sn, (4) a combination of Sn and Ag or the like can be pointed out. In cases of the respective combinations of (1), (2), (4), plating layers are successively formed such that an Au layer or an Ag layer is exposed to outside.

The wiring board of the invention can be fabricated by a method of forming firstly an external connecting pad (which will be a pad on one face side of the wiring board) on a support member comprising a metal of a copper plate, a copper foil or the like along with a surface plating layer, forming predetermined numbers of insulating layers and wiring layers thereon by a build up method, successively, forming an external connecting pad (which will be a pad on the other face side) and thereafter, removing the support member, at that occasion, there is carried out a processing of making a size of the external connecting pad smaller than that of the surface plating layer before forming the first insulating layer by the build up method.

According to the wiring board fabricated in this way, whereas the external connecting pad formed first on the support member becomes a pad smaller than the size of the surface plating layer, the external connecting pad at the other face side becomes larger than the surface plating layer. Mainly, the former pad can be used for mounting an electronic part of a semiconductor element or the like on a wiring board and the latter pad can be used for connecting to a mounting board. However, depending on cases, a way of use inverse thereto can be carried out.

EXAMPLES

Next, the invention will be explained further by examples. However, the invention is not limited to the examples shown here.

Example 1

According to the example, an explanation will be given of a wiring board in which an external connecting pad on a face of mounting a semiconductor element is smaller than a surface plating layer along with the fabricating method.

Figure 3A:
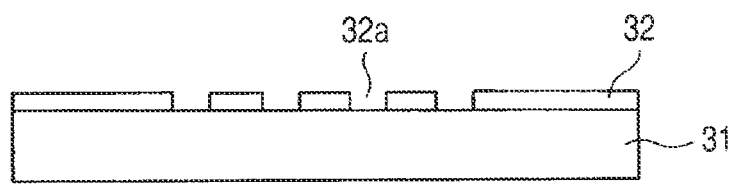
FIGS. 3A to 3D are first views for explaining fabrication of a wiring board of example 1.
Figure 3B:
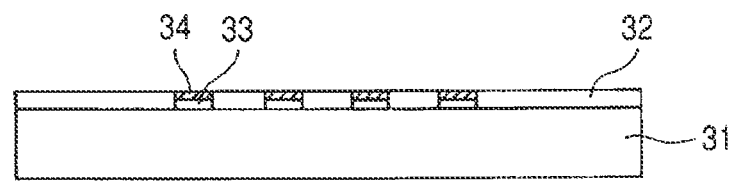

As shown by FIG. 3A, a plating resist pattern 32 is formed on a surface at a Cu plate constituting a support member 31. As the support member 31, other than the Cu plate, a Cu foil or a plate or a foil of a metal or an alloy capable of being removed by a normal etching solution can be utilized. As shown by FIG. 35, a surface plating layer 33 and an external connecting pad 34 are successively formed on the Cu plate exposed to a bottom portion of an opening portion 32a (FIG. 3A) (diameter 100 µm) of the plating resist pattern 32 by an electroless plating. In this case, the surface plating layer 33 is formed by an Au layer and an Ni layer respectively having thicknesses of 0.5 µm and 5 µm (the Au layer and the Ni layer are formed in this order). The external connecting pad 34 is formed by a thickness of 10 µm by Cu.

Figure 3C:
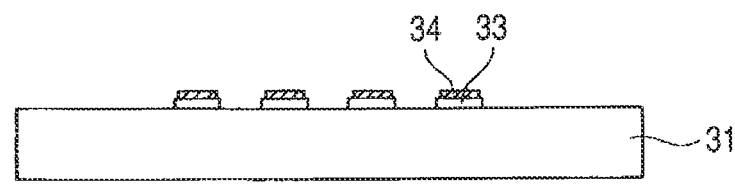
Figure 3D:
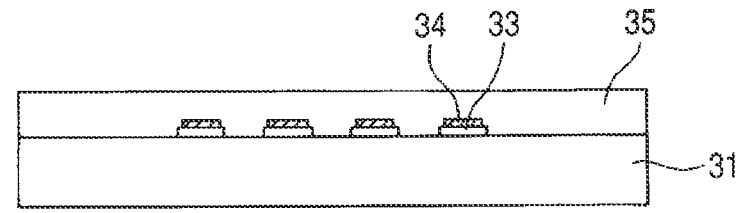

Next, the plating resist pattern 32 is exfoliated to remove, the external connecting pad 34 is selectively etched and a diameter thereof is made to be smaller than that of the surface plating layer 33 by about 1 through 3 µm (FIG. 3C). The selective etching of the external connecting pad 34 may be carried out before exfoliating the plating resist pattern 32 (in selectively etching of the external connecting pad 34 in this case, as shown by FIG. 12A), the resist pattern 32 is removed after etching the external connecting pad 34 by an etching solution for dissolving only Cu (FIG. 12B). Successively, as shown by FIG. 3D, an insulating layer 35 is formed by forming a resin film on a face of the support member 31 where the external connecting pad 34 is formed. In forming the insulating layer 35, a resin film of epoxy, polyimide or the like can be used.

Figure 4A:
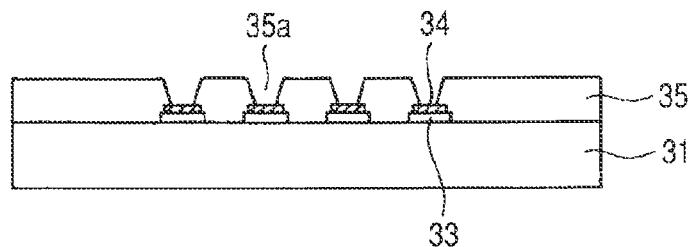
FIGS. 4A to 4D are second views for explaining fabrication of the wiring board of example 1.
Figure 4B:
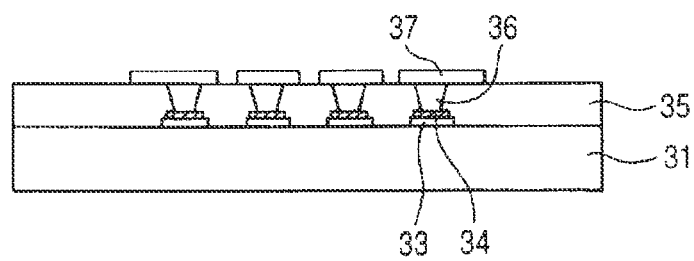

As shown by FIG. 4A, a via hole 35a is formed at the insulating layer 35 by laser machining. According to the via hole 35a, a diameter thereof is 60 µm at a surface of the insulating layer 35 and becomes about 50 µm at a bottom portion of exposing the pad 34. Successively, a via 36 connected to the pad 34 and a wiring layer 37 connected to the via 36 are formed (FIG. 4B). For example, a normal method of a semi additive method or the like can be utilized therefor.

Figure 4C:
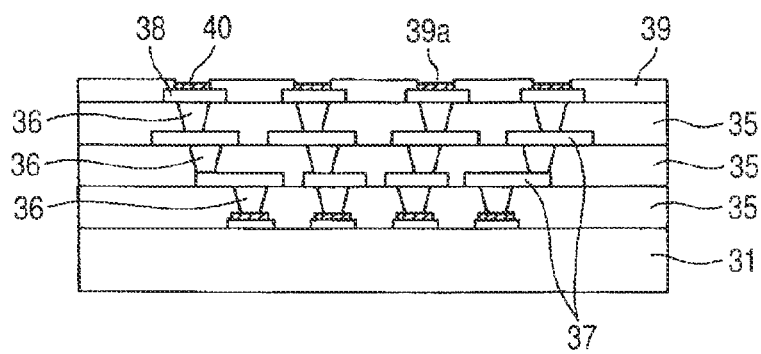
Figure 4D:
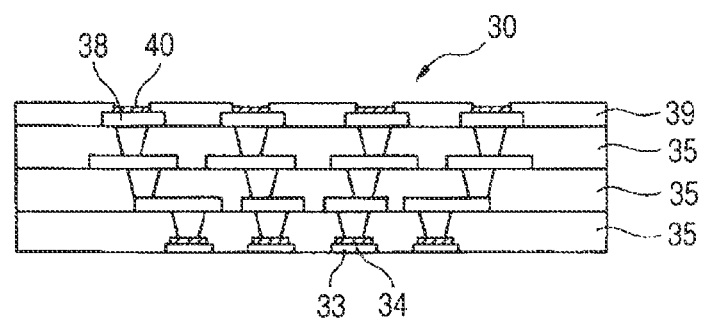

Successively, by repeating to form insulating layers and form via and wiring layers, as shown by FIG. 4C, predetermined numbers of the insulating layer 35 and the wiring layer 37 are formed, and an external connecting pad 38 is formed at the topmost insulating layer 35, thereafter, a solder resist layers 39 having an opening portion 39a communicating with a pad 38 is formed. Further, a surface plating layer 40 is formed on the pad 38 exposed at the opening portion 39a by electroless plating. As shown by FIG. 4D, the support member 31 is removed by etching and the wiring board 30 is completed. A face of the completed wiring board 30 removing the support member 31 becomes a semiconductor element mounting face.

Figure 5:
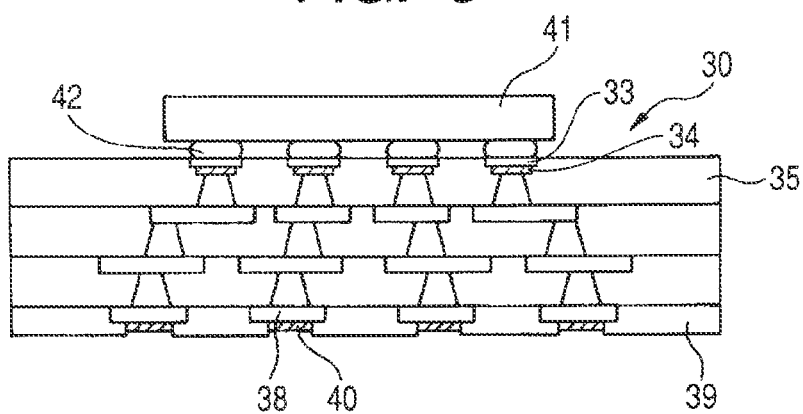
FIG. 5 is a view showing the wiring board of example 1 mounted with a semiconductor element.

FIG. 5 shows the wiring board 30 mounted with a semiconductor element 41. The semiconductor element 41 is connected to the wiring board 30 by a solder bonding member 42 by making a bump reflow.

Example 2

Here, an explanation will be given of an example of constituting a semiconductor element mounting face by a face reverse to that of the wiring board of example 1.

Figure 6A:
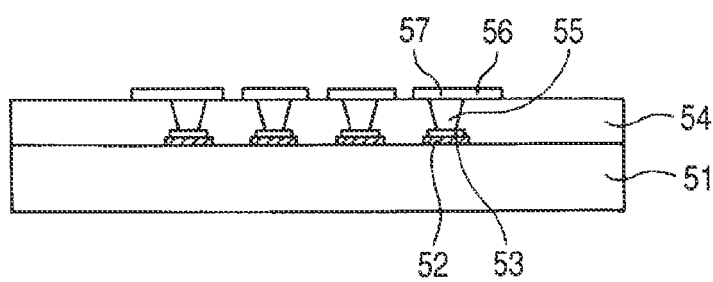
FIGS. 6A to 6C are views for explaining fabrication of a wiring board of example 2.
Figure 6B:
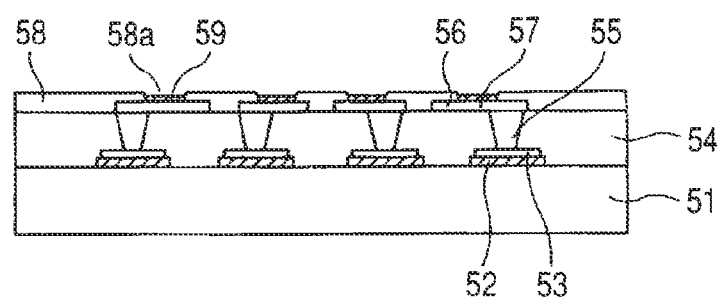
Figure 6C:
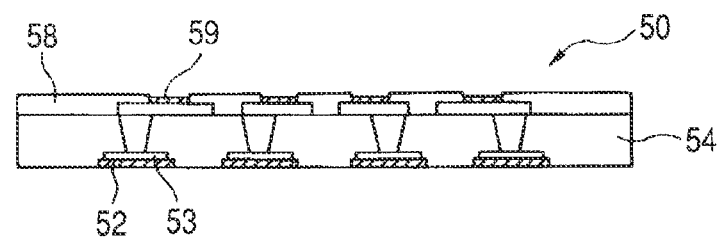

There is formed an intermediate product formed with a surface plating layer 52, an external connecting pad 53, an insulating layer 54, a via 55, and a wiring layer 56 on a support member 51 of a Cu plate as shown by FIG. 6A by the method explained in reference to FIGS. 3A through 3D and FIGS. 4A, 4B in example 1. An external connecting pad 57 is formed at a portion of a wiring of the wiring layer 56. Successively, as shown by FIG. 6B, a solder resist layer 58 having an opening portion 58a communicating with the pad 57 is formed and a surface plating layer 59 is formed on the pad 57 exposed at the opening portion 58a by electroless plating. A wiring board 50 is completed by removing the support member 51 by etching (FIG. 6C).

Figure 7:
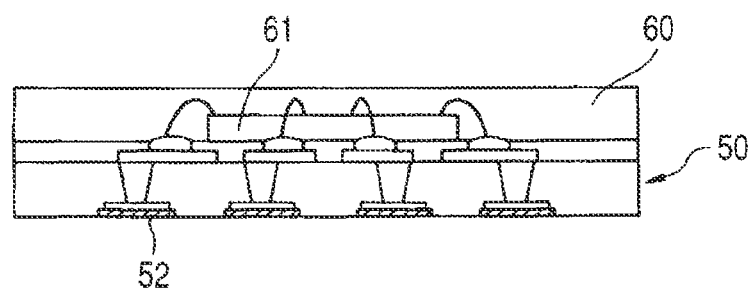
FIG. 7 is a view showing the wiring board of example 2 mounted with a semiconductor element.

FIG. 7 shows the wiring board 50 mounted with a semiconductor element 61. The semiconductor element 61 is connected to the wiring board 50 by wire bonding. A sealing resin 60 is formed on the wiring board 50 to cover the semiconductor element 61.

Further, the support member can also be removed after mounting the semiconductor element on the wiring board before removing the support member 51 (wiring board in a state shown in FIG. 6B).

Although in the above-described examples, an explanation has been given of the wiring board in which an outer side face of the surface plating layer formed to be larger than the external connecting pad is disposed on a plane the same as that of the insulating layer, there can be constituted also a wiring board in which a surface plating layer is recessed from a surface of an insulating layer, or the surface plating layer is projected from the surface of the insulating layer. Next, an example of such a wiring board will be explained.

Example 3

Here, an explanation will be given of a wiring board in which a surface plating layer is recessed from a surface of an insulating layer. A method of fabricating such a wiring board is basically similar to that explained in the previous examples, and therefore, an explanation will be given centering on a step of forming a structure in which a surface plating layer is recessed from a surface of an insulating layer.

Figure 8A:
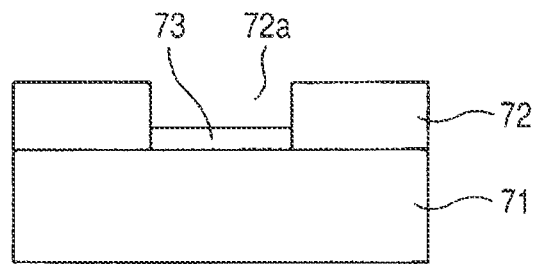
FIGS. 8A to 8D are views for explaining fabrication of a wiring board of example 3.
Figure 8B:
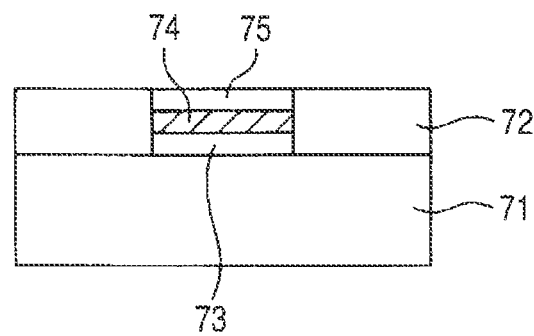

First, as shown by FIG. 8A, a plating resist pattern 72 having an opening portion 72a is formed at a surface of a Cu plate constituting a support member 71, and on the support member 71 exposed at a bottom portion of the opening portion 72a, a plating layer 73 of Cu of a material the same as that of the support member 71 is formed. Successively, a surface plating layer 74 comprising an Au layer and an Ni layer and an external connecting pad 75 of Cu are successively formed as shown by FIG. 8B similarly by an electroless plating.

Figure 8C:
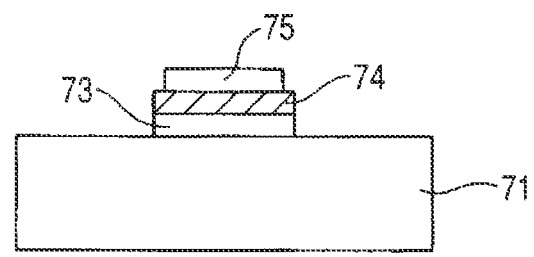
Figure 8D:
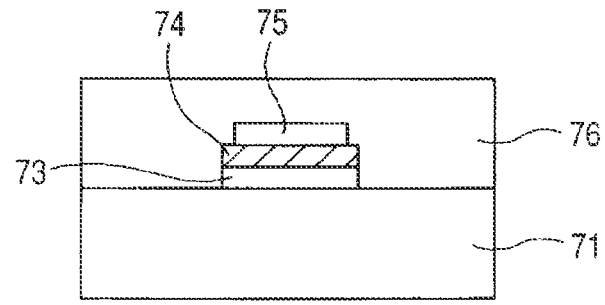

The plating resist pattern 72 is exfoliated to remove and the external connecting pad 75 is selectively etched to make a diameter thereof smaller than that of the surface plating layer 74 (FIG. 8C). Selective etching of the external connecting pad 75 may be carried out before exfoliating the plating resist pattern 72. Next, as shown by FIG. 8D, an insulating layer 76 is formed by laminating a resin film on a face of the support member 71 where the external connecting pad 75 is formed.

Figure 9:
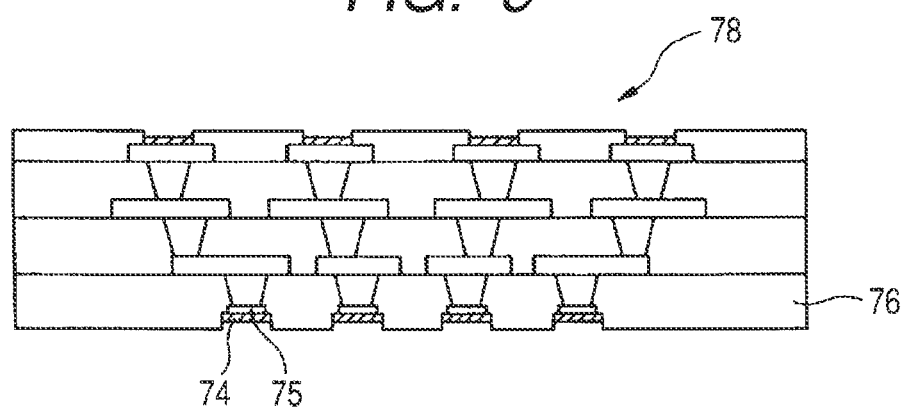
FIG. 9 is a view for explaining the wiring board fabricated in example 3.

Thereafter, by using the steps explained in reference to FIGS. 4A through 4D in example 1, a wiring board 78 shown in FIG. 9 is completed. According to the wiring board 78, in removing the support member 71 by etching, the plating layer 73 of a material the same as that of the support member 71 is removed along therewith and the surface plating layer 74 is constituted by a structure recessed from the surface of the insulating layer 76.

According to the wiring board 78, the surface plating layer 74 is disposed at the portion recessed from the surface of the insulating layer 76, and therefore, a solder ball for connecting to an external circuit can stably be mounted thereto.

Example 4

Here, an explanation will be given of a wiring board in which a surface plating layer is projected from a surface of an insulating layer. Also a method of fabricating such a wiring board is basically similar to that explained in the previous examples, and therefore, an explanation will be given centering on a step of forming a structure in which a surface plating layer is projected from a surface of an insulating layer.

Figure 10A:
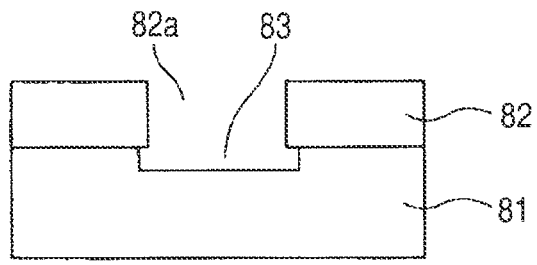
FIGS. 10A to 10D are views for explaining fabrication of a wiring board of example 4.
Figure 10B:
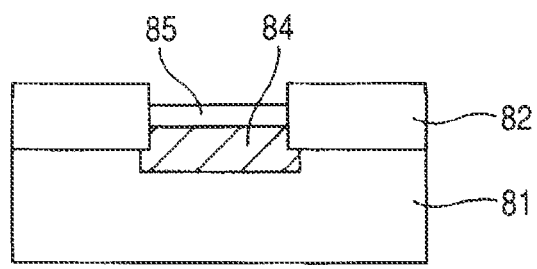

As shown by FIG. 10A, a plating resist pattern 82 having an opening portion 82a is formed on a surface of a Cu plate constituting a support member 81, and a recessed portion 83 is formed by etching a portion of the support member 81 exposed at a bottom portion of the opening portion 82a by constituting a mask by the pattern. Next, as shown by FIG. 10B, a surface plating layer 84 comprising an Au layer and a Ni layer is formed to fill the recessed portion 83 by electric plating, and an external connecting pad 85 is formed by electroless plating of Cu.

Figure 10C:
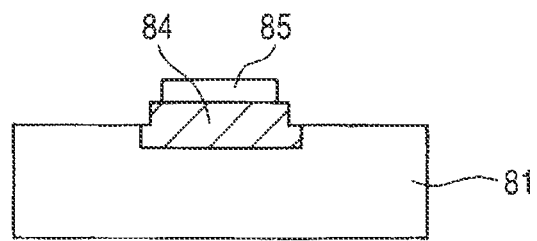
Figure 10D:
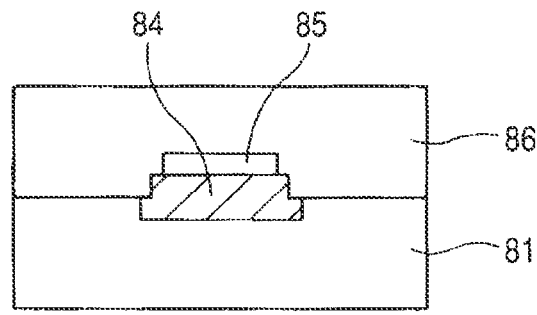

The plating resist pattern 82 is removed, the external connecting pad 85 is selectively etched, and a diameter thereof is made to be smaller than that of the surface plating layer 84 (FIG. 10C). Selective etching of the external connecting pad 85 may be carried out before removing the plating resist pattern 82. Successively, as shown by FIG. 100, an insulating layer 86 is formed by laminating a resin film on a face formed with the external connecting pad 85.

Thereafter, by using the steps explained in reference to FIGS. 4A through 4D in example 1, a wiring board 88 in which the surface plating layer 84 is projected from a surface of the insulating layer 86 is completed as shown by FIG. 11.

According to the wiring board 88, the surface plating layer 84 per se includes a wide width portion projected from the insulating layer 86 and a narrow width portion embedded to the insulating layer 86, a section thereof is constituted by a stepped shape, and therefore, a crack can further be prevented from being generated. Further, by projecting the surface plating layer 84, an amount of a solder (solder bonding member) in mounting a semiconductor element can be reduced and a bonding height of the semiconductor element can be stabilized.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of fabricating a wiring board, comprising steps of:
    forming a surface plating layer on a support member, and forming an external connecting pad on the surface plating layer formed on the support member such that an area of the external connecting pad formed on the surface plating layer is smaller than an area of the surface plating layer;
    after forming the surface plating layer and the external connecting pad, forming an insulating layer and a wiring layer on a surface of the support member where the external connecting pad is formed; and
    removing the support member from the external connecting pad and the surface plating layer, leaving the external connecting pad, the surface plating layer, the insulating layer, and the wiring layer.

2. The method of fabricating a wiring board according to claim 1, wherein forming the insulating layer and wiring layer on the surface of the support member where the external connecting pad is formed includes providing the insulating layer on the support member so as to cover the external connecting pad, such that the external connecting pad is embedded in the insulating layer, and
    removing the support member includes removing the support member from the insulating layer such that the insulating layer defines an outermost layer of the wiring board.

3. The method of fabricating a wiring board according to claim 1, wherein forming the surface plating layer on the support member, and forming the external connecting pad on the surface plating layer formed on the support member such that the area of the external connecting pad formed on the surface plating layer is smaller than the area of the surface plating layer includes forming a plating layer on the support member and then forming the surface plating layer and the external connecting pad on the plating layer, and
    removing the support member further includes removing the plating layer such that an upper surface of the surface plating layer is disposed so as to be recessed from a surface of the insulating layer defining an outermost layer of the wiring board.

4. The method of fabricating a wiring board according to claim 1, wherein forming the surface plating layer on the support member, and forming the external connecting pad on the surface plating layer formed on the support member such that the area of the external connecting pad formed on the surface plating layer is smaller than the area of the surface plating layer includes forming a recessed portion on the support member and forming the surface plating layer and the external connecting pad within the recessed portion, and
    removing the support member includes removing the support member such that an upper surface of the surface plating layer is disposed so as to protrude from a surface of the insulating layer defining an outermost layer of the wiring board.

5. The method of fabricating a wiring board according to claim 1, wherein forming the insulating layer and the wiring layer on the surface of the support member where the external connecting pad is formed includes stacking a plurality of insulating layers and wiring layers on the support member and forming another external connecting pad on the insulating layer defining an outermost layer of the wiring board.

6. The method of fabricating a wiring board according to claim 1, wherein forming the insulating layer and the wiring layer on the surface of the support member where the external connecting pad is formed includes providing the insulating layer defining an outermost layer of the wiring board on the support member so as to cover the external connecting pad, forming a via connected to a surface of the external connecting pad in the insulating layer defining the outermost layer of the wiring board, and forming the wiring layer connected to the via on the insulating layer defining the outermost layer of the wiring board.

7. The method of fabricating a wiring board according to claim 1, wherein forming the external connecting pad on the surface plating layer includes forming the external connecting pad of one of Cu and a Cu alloy.

8. The method of fabricating a wiring board according to claim 1, wherein forming the surface plating layer on the support member includes forming the surface plating layer of one of: a combination of Ni and Au; a combination of Ni, Pd, and Au; and a combination of Sn and Ag.

9. A method of fabricating a wiring board, comprising:
forming a surface plating layer on a support member, forming an external connecting pad on the surface plating layer formed on the support member, the external connecting pad having an area equal to that of the surface plating layer, and then processing the external connecting pad to remove an outer peripheral portion thereof to make the area of the external connecting pad smaller than the area of the surface plating layer;
forming an insulating layer and a wiring layer on a surface of the support member where the external connecting pad is formed; and
removing the support member.

10. The method of fabricating a wiring board according to claim 9, wherein the processing of the external connecting pad to make the area of the external connecting pad smaller than the area of the surface plating layer is carried out by etching.

11. The method of fabricating a wiring board according to claim 9, wherein the processing of the external connecting pad to make the area of the external connecting pad smaller than the area of the surface plating layer creates an interval in a horizontal direction between an outer peripheral portion of the external connecting pad and an outer peripheral portion of the surface plating layer.

* * * * *